US006932354B2

(12) United States Patent
Kane et al.

(10) Patent No.: US 6,932,354 B2
(45) Date of Patent: Aug. 23, 2005

(54) VALVE SEAL ASSEMBLY

(75) Inventors: Dale Robert Kane, San Francisco, CA (US); Norihisa Minowa, Kanagawa Prefecture (JP); Kohtaro Takahashi, Saitama (JP)

(73) Assignee: DuPont Dow Elastomers, LLC, Wilmington, DE (US)

( * ) Notice: Subject to any disclaimer, the term of this patent is extended or adjusted under 35 U.S.C. 154(b) by 186 days.

(21) Appl. No.: 10/359,374

(22) Filed: Feb. 6, 2003

(65) Prior Publication Data

US 2003/0164596 A1 Sep. 4, 2003

Related U.S. Application Data

(63) Continuation-in-part of application No. 10/346,833, filed on Jan. 17, 2003, now abandoned.

(60) Provisional application No. 60/353,400, filed on Jan. 31, 2002.

(51) Int. Cl.[7] .......................... F16L 17/06; F16K 15/00

(52) U.S. Cl. ...................... 277/608; 277/616; 277/628; 277/637; 277/640; 251/333

(58) Field of Search ................................ 277/608, 616, 277/628, 630, 637, 640, 641; 251/63.5, 333

(56) References Cited

U.S. PATENT DOCUMENTS

| | | | |
|---|---|---|---|
| 2,665,461 | A | 1/1954 | Rodgers |
| 2,870,987 | A | 1/1959 | Greenwood |
| 3,693,986 | A | 9/1972 | Lambie |
| 4,474,358 | A | 10/1984 | Bennett |
| 5,013,009 | A | 5/1991 | Nelson |
| 5,482,297 | A | 1/1996 | Burns et al. |
| 5,579,718 | A | 12/1996 | Freerks |
| 6,089,537 | A | 7/2000 | Olmsted |
| 6,089,543 | A | 7/2000 | Freerks |
| 6,409,149 | B1 | 6/2002 | Maher, Jr. |

*Primary Examiner*—Alison Pickard
*Assistant Examiner*—Enoch Peavey

(57) ABSTRACT

The present invention is directed to a valve seal assembly for use in multi-chamber vacuum devices. The seal assembly comprises a door and a deformable seal ring running along the periphery of the door, wherein the seal ring is held in place by a reversibly mounted securing means such as a disk, ring or clamp.

10 Claims, 1 Drawing Sheet

10 2 14 16 12 2

10 12 34 32 16 26 24 12 22 30 20 18 14

VALVE SEAL ASSEMBLY

CROSS-REFERENCE TO RELATED APPLICATIONS

This application is a continuation-in-part of U.S. application Ser. No. 10/346,833, filed Jan. 17, 2003 ABN which claims the benefit of U.S. Provisional Application 60/353,400, filed Jan. 31, 2002.

FIELD OF THE INVENTION

The present invention relates to a seal assembly for valves and in particular to a gate valve or pendulum valve seal assembly having a replaceable deformable seal ring, said assembly finding particular use in forming a seal between chambers in vacuum equipment employed in the semiconductor industry for chip manufacture.

BACKGROUND OF THE INVENTION

Integrated circuit (IC) chips are typically manufactured in multi-chambered vacuum equipment. Each chamber may contain a different environment, e.g. atmosphere, temperature, and pressure, than adjacent chambers. Chambers are typically isolated from each other by gate valves (or slit valves). Such valves may be utilized for moving semiconductor wafers from one chamber to another. In addition, pendulum valves may be employed to separate chambers from a vacuum source and for the feeding or exhausting of gases. In both gate valves and pendulum valves, sealing is affected by closing a sealing member, also referred to as a disk or door, portion of the valve. Generally, the door comprises a metal plate, sized and shaped for covering the opening within the valve, and a deformable seal, or O-ring, mounted on the sealing surface of the door, near its periphery. The deformable seal is typically made from an elastomeric or thermoplastic polymer.

During use in the manufacture of IC chips, the deformable door seal is exposed to high temperatures and to corrosive plasmas. The latter conditions, coupled with repeated opening and closing of the door, causes the deformable seal ring to deteriorate and, eventually need to be replaced. Deformable seal replacement has been problematic.

Early door designs featured a dovetail-shaped groove running along the periphery of the door sealing surface. The groove was used to hold a deformable O-ring seal or a modified O-ring (U.S. Pat. No. 5,482,297). However, in use, the deformable seal ring could undesirably pop out of the groove when the gate valve door was opened. It could also be difficult and time consuming to install a replacement seal ring within the groove without damaging the seal.

A more recent door design is disclosed in U.S. Pat. No. 6,089,543 wherein the gate valve door comprises a mounting member and a seal plate attached thereto, wherein a deformable seal ring is mounted onto the outer surface of the seal plate. In this design, the deformable seal ring is preferably bonded, by molding in place, onto the seal plate. When it is desired to replace a worn deformable seal ring, the seal plate/deformable seal assembly is readily detached from the mounting member and discarded. A new seal plate/deformable seal assembly is then attached to the mounting member. This design has the economic and environmental disadvantage of not re-using the old seal plate.

U.S. Pat. No. 5,579,718 discloses a slit valve door having a removable O-ring seal that is held in place within a groove that is partially formed by the door and partially formed by a removable wedge insert. However, it may be difficult to install the O-ring seal in this door groove without twisting the O-ring. Twisting can cause premature seal failure.

It is an object of the present invention to provide a valve door having a securely mounted deformable seal element which may be quickly replaced when desired, without the need for replacing a large portion of the door and without damaging the seal element.

SUMMARY OF THE INVENTION

The present invention is directed to a valve seal assembly for use in sealing an opening in a chamber employed in vacuum equipment, particularly in semiconductor manufacturing equipment.

Specifically an aspect of the invention is a valve seal assembly for use in vacuum chambers of semiconductor manufacturing equipment, said valve assembly comprising:

a) a door having a groove for receiving a seal ring, said groove formed on a sealing surface near a periphery of said door, and wherein a first portion of said groove is formed of a base, an outer sidewall and outer lip in said door;

b) a securing means for holding a seal ring within said groove on said door, said securing means having an outer sidewall and lip which forms a second portion of said groove;

c) fastening means for attaching said securing means to said door; and d) a deformable seal ring shaped and sized to complementarily fit within said groove, said seal ring comprising a first thin portion for complementarily engaging said first portion of said groove and a second thin portion for complementarily engaging said second portion of said groove, and said seal ring having a thick portion located between said first and second thin portions and sized to extend beyond said door lip.

BRIEF DESCRIPTIONS OF THE DRAWINGS

DETAILED DESCRIPTION OF THE INVENTION

Figure 1:
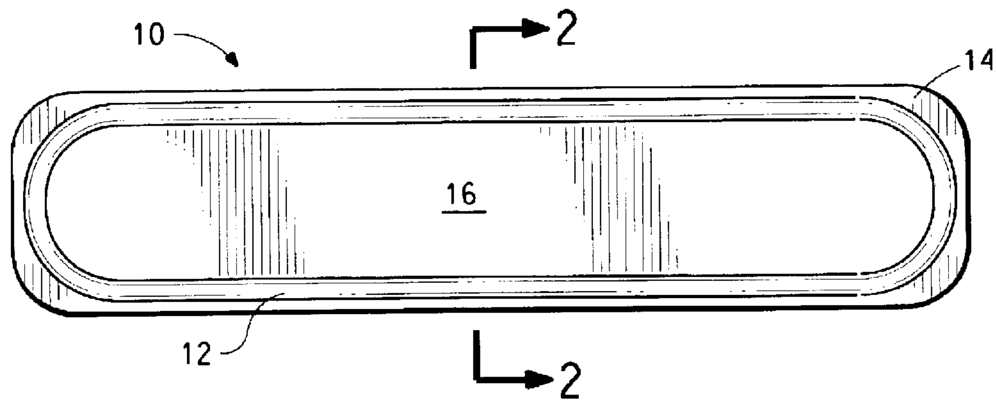
FIG. 1 is a plan view of an embodiment of the seal assembly of this invention.

FIG. 1 shows a plan view of the valve door seal assembly 10 of this invention wherein a deformable seal ring 12 is mounted in a groove near the periphery of the sealing surface of door 14 and held in place by securing means 16. By "sealing surface" is meant the surface of the door which covers the opening that is sealed when the valve is closed.

Figure 2:
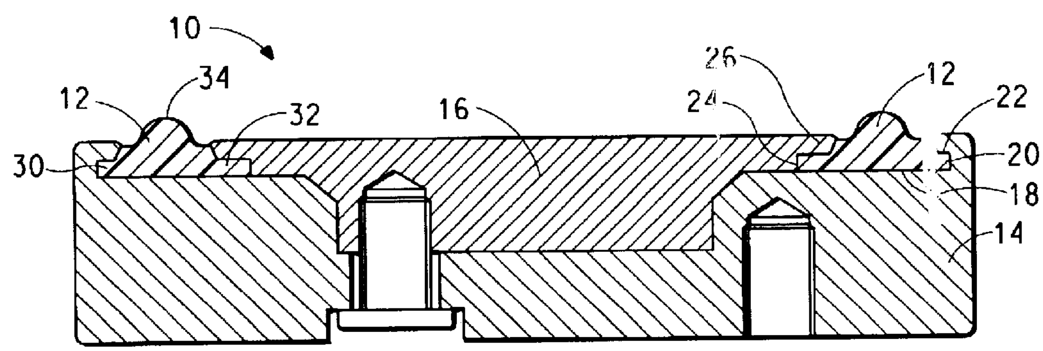
FIG. 2 is a cross-section view of an embodiment of the seal assembly of this invention taken along lines 2—2 of FIG. 1.

FIG. 2 shows, in cross-section along 2—2, the door assembly of this invention. Seal ring 12 is reversibly mounted on the base 18 of a groove on the sealing surface of door 14. The groove has an outer side wall 20 and an outer lip 22 for complementarily engaging a relatively thin outer portion 30 of deformable seal ring 12. Securing means 16 has an outer side wall 24 and outer lip 26 for complementarily engaging a relatively thin inner portion 32 of deformable seal ring 12. Seal ring 12 has a relatively thick portion 34 located between thin portions 30 and 32. Thick portion 34 is generally parabolic-shaped and it is sized to extend above the lips of both door 14 and securing means 16 for sealing engagement with the surface (i.e. mating flange) surrounding the opening in the valve (not shown). The shape of seal ring 12 results in the requirement for only a relatively minor compressive force in order to form an effective seal under high vacuum. Much more force would be required if seal ring 12 were an O-ring.

Although securing means 16 is shown as a solid disk or wedge in the figures, one skilled in the art would readily recognize that the securing means could equally be a continuous ring, a non-continuous ring, or a series of brackets. Such alternate embodiments are contemplated in this invention. Securing means 16 is reversibly attached to door 14 by fastening means 28.

Figure 3:
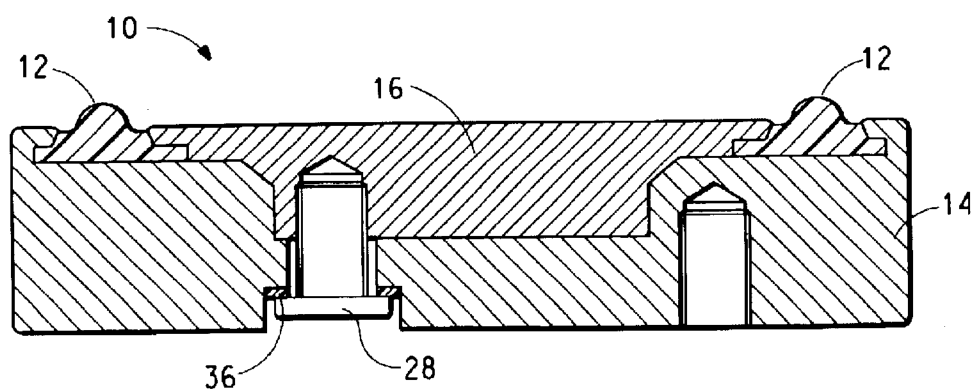
FIG. 3 is a cross-section view of another embodiment of the seal assembly of this invention taken along lines 2—2 of FIG. 1.

Fastening means 28 may include bolts (as shown in FIG. 2), screws, pins, adhesives, etc. Such alternative embodiments are included in the present invention. The number and location of fastening means required to adequately attach securing means 16 to door 14 depends upon the shape and size of the securing means and may be readily determined by the skilled practitioner. Optionally, second seal 36 may be used with fastening means 28 (FIG. 3) to form an airtight seal between the fastening means and the door. This ensures that a vacuum leak does not occur due to poor mating between door 14, seal ring 12 and securing means 16. Second seal 36 may be a washer, O-ring, square gasket, or the like.

Door 14 and securing means 16 can be fabricated from metals such as stainless steel, aluminum, or other non-deformable metal. The door and securing means may be made of the same material or of different material. Securing means 16 can also be made from polymers having either a modulus or a hardness much greater than that of the material used as the seal ring 12. Polymers, useful for preparation of the securing means include, but are not limited to nylon, polyether ether ketone (PEEK), polyether sulfone (PES), polytetrafluoroethylene (PTFE), polyimide, or an organic or inorganic composite. Preferably the door and securing means are made of steel or aluminum, most preferably a stainless steel such as 316L, or anodized aluminum.

Seal ring 12 may be fashioned out of elastomer (preferably) or other deformable material such as a thermoplastic resin (e.g. copolymers of tetrafluoroethylene) that is thermally stable and inert to the plasma which is employed in the chip manufacturing equipment. Suitable elastomers include silicone rubber, nitrile rubber, hydrogenated nitrile rubber, EPDM, copolymers of ethylene and an alpha olefin having at least four carbon atoms, and fluoroelastomers, including perfluoroelastomers. For applications requiring seals that may be exposed to high temperatures, harsh chemicals or require very low extractables, a perfluoroelastomer is the preferred elastomer. By "perfluoroelastomer" is meant copolymers comprising copolymerized units of tetrafluoroethylene and copolymerized units of a perfluoro (alkyl vinyl ether) or a perfluoro(alkoxy vinyl ether). Such copolymers may also contain a minor amount (preferably less than 7 mole percent, based on the total number of moles of comonomers) of a cure site such as Br, I, CN, or H. Perfluoroelastomers have been extensively described in the prior art. See, for example, U.S. Pat. Nos. 4,035,565; 4,281,092; 4,529,784; 4,487,903; 5,789,489; 5,936,060; 6,140,437; 6,211,319 B1 and 6,281,296 B1.

Optional second seal 36 may be fashioned out of any of the materials mentioned above as suitable for seal ring 12. However, since second seal 36 is never exposed to plasmas, it need not be made from expensive perfluoroelastomer or other plasma inert material.

Worn seal ring 12 may easily be replaced in the present invention by the steps of a) disengaging fastening means 28, b) removing securing means 16, c) replacing the worn seal ring with a new seal ring, d) repositioning securing means 16 and e) engaging fastening means 28. The new seal ring easily slides into the groove without twisting.

Finite Element Analysis (FEA) studies of 1) the valve seal assembly of the present invention in the embodiment of a slit valve and 2) the door seal assembly of U.S. Pat. No. 5,579,718 indicate that the door seal of the present invention has a higher contact pressure against the mating flange (while under the same compressive load) than does the U.S. Pat. No. 5,579,718 door seal assembly. This results in better vacuum sealing performance for the seal assembly of the present invention.

The present valve seal assembly finds use in vacuum sealing applications, particularly in gate or slit valves and in pendulum valves utilized in the sealing of vacuum chambers in semiconductor chip manufacturing equipment. Besides the preferred embodiments of the invention illustrated in the drawings and described in detail above, the skilled artisan will readily understand that the invention is capable of alternative embodiments. For example, in order to provide space for thermal expansion of the seal ring, the groove sidewall radius, seal ring width and the undercut geometry of the securing means may be adjusted. Accordingly the invention should not be strictly limited in scope to the preferred embodiments.

What is claimed is:

1. A valve seal assembly for use in vacuum chambers of semiconductor manufacturing equipment, said valve assembly comprising:

a) a door having a groove for receiving a seal ring, said groove formed on a sealing surface near a periphery of said door, and wherein a first portion of said groove is formed of a base, an outer sidewall and outer lip in said door;

b) a securing means for holding a seal ring within said groove on said door, said securing means having an outer sidewall and lip which forms a second portion of said groove, said securing means complementarily shaped and sized to contact said door between said groove and fastening means;

c) disengageable fastening means for reversibly attaching said securing means to said door, said fastening means having a second seal between said fastening means and said door; and d) a deformable seal ring shaped and sized to complementarily fit within said groove, said seal ring comprising a first thin portion for complementarily engaging said first portion of said groove and a second thin portion for complementarily engaging said second portion of said groove, and said seal ring having a thick parabolic-shaped cross-section portion located between said first and second thin portions and sized to extend above both said door lip and said securing means lip for sealing engagement with a mating flange.

2. A valve seal assembly of claim 1 wherein said securing means is selected from the group consisting of a wedge, a disk, a continuous ring, a non-continuous ring and brackets.

3. A valve seal assembly of claim 2 wherein said securing means is fabricated from a material selected from the group consisting of stainless steel and aluminum.

4. A valve seal assembly of claim 2 wherein said securing means is fabricated from a material selected from the group consisting of nylon, polyether ether ketone, polyether sulfone, polytetraflouroethylene, polyimide, an organic composite and an inorganic composite.

5. A valve seal assembly of claim 1 wherein said seal ring is fabricated from a material selected from the group consisting of an elastomer and a thermoplastic resin.

6. A valve seal assembly of claim 5 wherein said seal ring is fabricated from a material selected from the group consisting of silicone rubber; nitrile rubber; hydrogenated nitrile rubber; EPDM; copolymers of ethylene and an alpha olefin having at least four carbon atoms; fluoroelastomers; and perfluoroelastomers.

7. A valve seal assembly of claim 6 wherein said seal ring is fabricated from a perfluoroelastomer.

8. A valve seal assembly of claim 1 wherein said fastening means is selected from the group consisting of bolts and screws.

9. A valve seal assembly of claim 1 wherein said assembly is in a gate valve.

10. A valve seal assembly of claim 1 wherein said assembly is in a pendulum valve.

* * * * *